United States Patent [19]

Dwyer et al.

[11] Patent Number: 4,558,345
[45] Date of Patent: Dec. 10, 1985

[54] MULTIPLE CONNECTION BOND PAD FOR AN INTEGRATED CIRCUIT DEVICE AND METHOD OF MAKING SAME

[75] Inventors: Robert A. Dwyer; James E. Gillberg, both of Hunterdon, N.J.

[73] Assignee: RCA Corporation, Princeton, N.J.

[21] Appl. No.: 546,181

[22] Filed: Oct. 27, 1983

[51] Int. Cl.[4] .................. H01L 23/12; H01L 25/52
[52] U.S. Cl. .............................. 357/68; 357/65; 357/70; 357/80
[58] Field of Search ................. 357/68, 65, 70, 80

[56] References Cited
U.S. PATENT DOCUMENTS

| 3,673,427 | 6/1972 | McCoy et al. | 357/68 |
| 4,091,529 | 5/1978 | Zaleckas | 29/628 |
| 4,142,288 | 3/1979 | Flammer et al. | 29/628 |
| 4,204,218 | 5/1980 | Fox et al. | 357/68 |
| 4,223,337 | 9/1980 | Kojima et al. | 357/68 |
| 4,301,464 | 11/1981 | Otsuki et al. | 357/70 |

Primary Examiner—Andrew J. James
Assistant Examiner—Sheila V. Clark
Attorney, Agent, or Firm—Birgit E. Morris; Donald S. Cohen; James M. Trygg

[57] ABSTRACT

A bond region is provided on an integrated circuit chip wherein the bond region has two or more sets of closely spaced conductors, each of which is electrically connected to a different point of the integrated circuit. During the manufacturing of the device, at the time of assembly of the chip into the package one end of a connector wire may, optionally, be bonded to the bond region thereby effecting a multiple connection of these different points of the integrated circuit. Such a procedure will enable a specific mode of operation of a multi-mode device.

14 Claims, 3 Drawing Figures

MULTIPLE CONNECTION BOND PAD FOR AN INTEGRATED CIRCUIT DEVICE AND METHOD OF MAKING SAME

The present invention relates to integrated circuit devices and their manufacture wherein the semiconductor chip has bond pads joined along its periphery which are connected to the leads of the package containing the device by a series of connector wires. More particularly, the present invention relates to an arrangement of bond pads or similar structure whereby the mode of operation of the device is effected by the selective bonding of the connector wires to the bond pad structures.

BACKGROUND OF THE INVENTION

For purposes of this description, there are two broad categories of integrated circuit devices: (1) single mode devices and (2) multiple mode devices. In the case of a single mode device, there is generally a specific hook up arrangement which must be adhered to when connecting the leads of the chip to external circuitry. The multiple mode device, however, will allow one of two or more such hook up arrangements, depending upon the requirements of a specific application. It is this latter type of device to which the present invention pertains.

By way of example we shall assume that a certain integrated circuit chip is useful for processing signals that are produced by a microprocessor (MPU) and transmitted to the chip over bus lines. The MPU may be either of two well known units: one selected from the Motorola Model 6800 series and the other selected from the RCA Model 1800 series, both of which produce data signals and address signals. The RCA MPU provides data signals on one output line and address signals on another output line, each output line being completely independent of the other. Therefore, provision is made for the chip to accept these two MPU outputs on two separate bond pads, one of which is connected to the data bus of the integrated circuit via a data latch which is latched open to permit passage of data and the other of which is connected to an address store circuit through an address latch which is latched open to permit passage of address signals. The Motorola MPU, on the other hand, provides the low order bits of the address alternately time sliced with data signals on a single output line. This output must therefore be impressed on two separate bond pads of the chip, the first of which is, as before, connected to the data bus via a data latch and the second of which is connected to the low order bits of the address bus via an address latch. To permit the integrated circuit to properly interface with the Motorola MPU, a latch enable signal must be supplied to the integrated circuit for the data latch thereby disabling the data bus at times when address signals appear on the output and for enabling the data bus at other times. Similarly, another latch enable signal must be provided to enable the address latch and thereby disable the address bus at times when data signals appear on the output and to enable the address bus at other times. The above hypothetical example very briefly describes an integrated circuit chip having two modes of operation, one being enabled for interface with RCA MPU and the other being enabled for interface with the Motorola MPU. Selection of the Motorola mode is automatically effected by impressing the single output line on the two appropriate bond pads of the chip.

When selecting a particular function or operating mode of a multi-function device a variety of hook up arrangements may be used including electrically connecting two or more bond pads together, omitting specific connections, and transposing certain connections. When two or more bond pads must be connected together, as in the Motorola case described above, it is conventionally accomplished by connecting each pad individually to its respective lead by a connector wire, then tying the two leads together with a jumper wire outside of the device package. Such a procedure requires that two connector wires and two leads be provided for each pair of pads that must be connected together. This renders the device somewhat less reliable because of the additional connections, four internal bond points and two external connections, and reduces the number of functioning leads that may be brought out of the package. Another method of connecting two or more pads together, which is less commonly used, is to connect each pad individually to a common lead by a pair of connector wires. This, of course, necessitates the making of two connections on a single lead which requires that the lead be sufficiently wide to accommodate the two bond points. Here again there are two connector wires and four bond points. What is desired is the capability of electrically connecting a single lead of the package to two or more bond pads at a single bond point using a single connector wire.

SUMMARY OF THE INVENTION

According to the present invention a multiple connection bond pad for an integrated circuit device and method for making same is provided. The device has formed thereon an integrated circuit selectively capable of operating in any of a plurality of modes of operation. A plurality of conductors are arranged within and electrically connected to the integrated circuit so that when the conductors are electrically separate the circuit is operable in one of the plurality of modes of operation. When two or more of the conductors are electrically connected the circuit is operable in another of the modes of operation. A bond region means is provided for effecting an electrical connection between at least two of the plurality of conductors only when a portion of a conducting material is bonded to the bond region means.

DESCRIPTION OF THE PREFERRED EMBODIMENT

Figure 1:
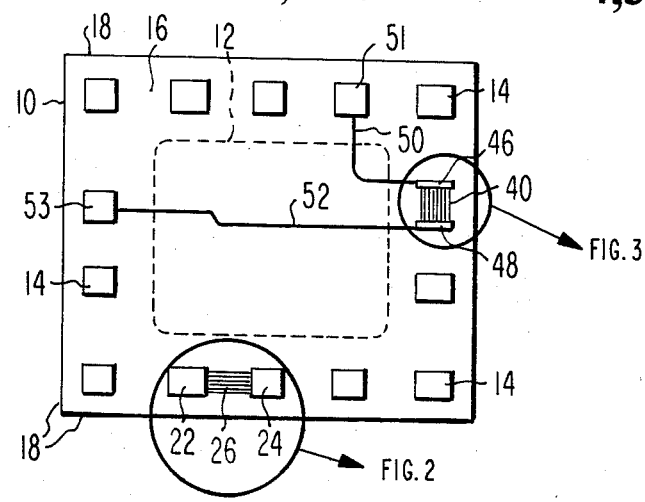
FIG. 1 is the top view of an integrated circuit chip embodying the teachings of the present invention.

There is shown in FIG. 1 an integrated circuit chip 10 having a surface 16, an outer periphery 18, and an integrated circuit formed thereon within the area enclosed by dashed lines indicated at 12. A plurality of bond pads 14 are arranged on the surface 16 near the outer periphery 18. The bond pads 14 are connected to various points in the integrated circuit by metalized conductors that are not shown.

Figure 2:
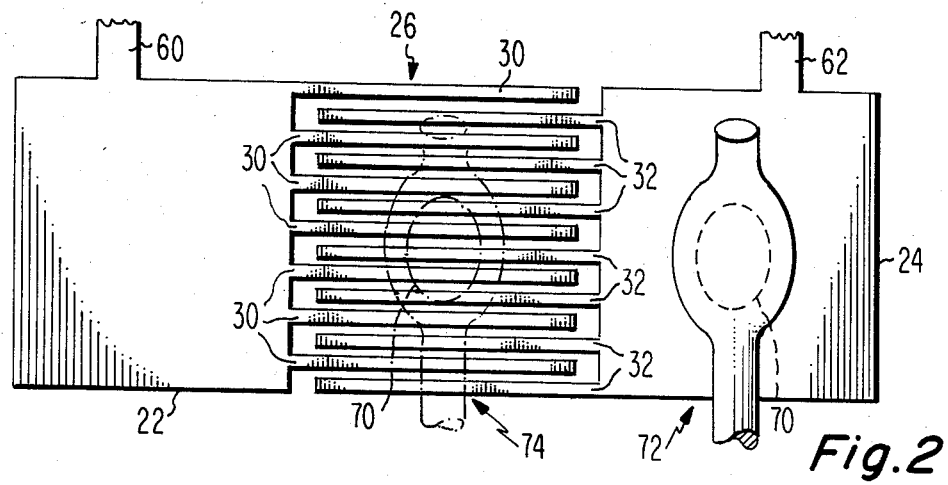
FIG. 2 is an enlarged view of the area indicated at 2 in FIG. 1.

A pair of adjacent bond pads 22 and 24, shown in FIGS. 1 and 2, are arranged with a bond region 26 disposed therebetween and shown enlarged in FIG. 2.

The bond region 26 comprises two sets of closely spaced interlayed conductors 30 and 32 which are electrically separate and independent. The conductors 30 are all electrically attached to the bond pad 22 at one of their ends and are electrically open at their other ends. Similarly the conductors 32 are all electrically attached to the bond pad 24 at one of their ends and are electrically open at their other ends.

Figure 3:
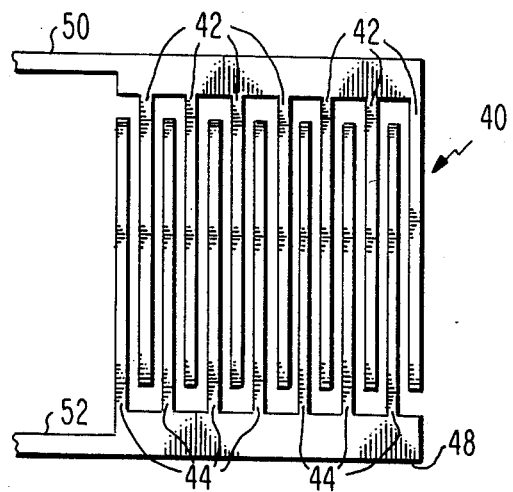
FIG. 3 is an enlarged view of the area indicated at 3 in FIG. 1.

Another bond region 40, shown in FIG. 1, is shown enlarged in FIG. 3. The bond region 40 is similar to the bond region 26 in that it comprises two sets of closely spaced interlayed conductors 42 and 44 which are electrically separate and independent. The conductors 42 are all electrically attached at one of their ends to a feed conductor 46 disposed normal thereto and are electrically open at their other ends. Similarly the conductors 44 are all electrically attached at one of their ends to a feed conductor 48 disposed normal thereto and also are electrically open at their other ends. The feed conductor 46 is connected to a bond pad 51 via a metalized conductor 50, and the feed conductor 48 is connected to a bond pad 53 which is remote from both the pad 51 and the bond region 40 via a metalized conductor 52. In this way a bond region may be defined in any convenient space without consideration of location of the bond pads associated therewith.

In both cases described above the sets of conductors 30,32 and 42,44 are relatively long, slender, and closely spaced for a substantial portion of their respective lengths and are formed concurrently with the bond pads 22 and 24 and the feed conductors 46 and 48. The width of each conductor is determined, of course, by their quantity and spacing. Preferably, from 7 to 10 conductors will be provided in each set substantially equally spaced with the space between adjacent conductors being approximately equal to 3 times the width of one of the conductors. Thus, with the conductors of both sets interlayed, each conductor is separated by a space approximately equal to the width of one of the conductors. By way of example, bond pads presently in use are from 5 to 6 mils on a side. This is considered a reasonable size for the bond regions. Assuming 7 conductors in each of two sets of interlayed conductors each conductor and each space between conductors would have a width of approximately 0.2 mil.

The bond footprint 70, that is, the area of contact between the connecting wire and the bond region, varies from between 1½ mils and 4 mils, depending on the temperature and pressure applied during the bonding operation. See FIG. 2. In the example given above, a footprint of 1½ mils positioned completely within the confines of the bond region would provide a connector wire contact to two conductors from each set of conductors.

The above descriptions of the bond regions 26 and 40 illustrate the teachings of the present invention with respect to connecting together two bond pads. However, it will be understood that three or more bond pads may be arranged with respect to a common bond region having three or more sets of closely spaced interlayed conductors, one set for each different bond pad. One end of each conductor of a particular set is electrically connected to the bond pad associated with that set and the other end is electrically open. As with the bond regions 26 and 40, the three or more sets of conductors, while closely spaced and interlayed, are electrically separate and independent. With this arrangement several bond pads may be electrically connected together by bonding a portion of a conducting material to their associated bond region.

In operation, the bond region 26 is used where two adjacent bond pads are to be connected to a single lead of a package containing an integrated circuit device for effecting a specific mode of operation of the integrated circuit. Consider the example of the multi mode chip set forth above wherein a certain integrated circuit chip would, in a first mode of operation accept a data signal on a first bond pad and an address signal on a second bond pad. When the chip is in a second mode of operation, on the other hand, it would accept both data and address signals at alternating times on the first bond pad which must be electrically connected to the second bond pad. A pair of switchs, internal to the chip, would be timed to correspond with the alternating data and address signals to enable the data input to the integrated circuit and disable address input when data signals appear on the first bond pad and disable data input and enable address input at other times. The above is accomplished by equipment and procedures that are well known in the art and therefore will not be described further here. In this example, the bond pad 22 is electrically connected to the address bus of the integrated circuit via a metalized conductor 60 and the bond pad 24 is electrically connected to the data bus of the integrated circuit via a metalized conductor 62. When the first mode of operation is desired, one end of a connecting wire is bonded to the bond pad 24, as shown at 72 in FIG. 2, and the other end is bonded to the lead, not shown, that represents the data signal input to the chip. When the second mode of operation is desired, one end of the connecting wire is bonded to the bond region 26, as shown by dashed lines at 74 in FIG. 2, and the other end is bonded to the lead, not shown, that represents the input to the chip having alternating data and address signals. In this case the bonding of the connector wire to the bond region effects a three way electrical connection between the connector wire and the two bond pads 22 and 24.

This invention provides a novel arrangement for the interconnection of two or more bond pads on an integrated circuit chip for rendering the circuit operable in one of a plurality of modes of operation. The important advantages achieved thereby are increased reliability of the device due to fewer interconnecting wires and associated bond points and a full complement of functioning leads that may be brought out of the device.

We claim:

1. An integrated circuit device having formed thereon:
   (a) an integrated circuit selectively capable of operating in any of a plurality of modes of operation;
   (b) a plurality of conductor paths arranged within and electrically connected to said integrated circuit so that when said conductor paths are electrically separate said integrated circuit is operable in one of said plurality of modes of operation and when two or more of said plurality of conductor paths are electrically connected said integrated circuit is operable in another of said plurality of modes of operation; and
   (c) a bond region means for effecting an electrical connection between at least two of said plurality of conductor paths only when a portion of a conducting material is bonded to said bond region means.

2. The device set forth in claim 1 including a plurality of circuit components formed integral to said integrated circuit and a plurality of bond pads formed thereon, wherein said plurality of conductor paths each have a first end that is connected to one of said plurality of circuit components and a second end that is connected to a different one of said plurality of bond pads.

3. The device as set forth in claim 2 wherein said bond region means comprises a plurality of closely spaced conductors each of which has a free end and a connected end, wherein each of said connected ends is connected to a different one of said plurality of bond pads and each of said conductors is disposed adjacent to and spaced apart from another of said conductors.

4. The device as set forth in claim 2 wherein said bond region means comprises a first set of closely spaced conductors electrically connected to one of said plurality of bond pads and a second set of closely spaced conductors electrically connected to another of said plurality of bond pads, wherein said first and second sets of closely spaced conductors are mutually interlayed for a substantial portion of their respective lengths so that each conductor of said first set is adjacent to and spaced apart from a conductor of said second set whereby said first and second sets of conductors are electrically separate.

5. The device as set forth in claim 4 wherein said conducting material is a connector wire.

6. The device as set forth in claim 5 wherein said conductors of said first and second sets of conductors are arranged substantially coplanar and mutually substantially parallel.

7. An integrated circuit device having a plurality of curcuit components formed thereon including a plurality of bond pads electrically connected to said circuit components and a bond region means for effecting an electrical interconnection between at least two of said plurality of bond pads only when a portion of a connector wire is bonded to said bond region means.

8. The device as set forth in claim 7 wherein said bond region means comprises a plurality of closely spaced conductors each of which has a free end and a connected end, wherein each of said connected ends is connected to a different one of said plurality of bond pads and each of said conductors is disposed adjacent to and spaced apart from another of said conductors.

9. The device as set forth in claim 7 wherein said bond region means comprises a first set of closely spaced conductors electrically connected to one of said plurality of bond pads and a second set of closely spaced conductors electrically connected to another of said plurality of bond pads, wherein said first and second sets of closely spaced conductors are mutually interlayed for a substantial portion of their respective lengths so that each conductor of said first set is adjacent to and spaced apart from a conductor of said second set whereby said first and second sets of conductors are electrically separate.

10. The device as set forth in claim 9 including a connector wire having one portion thereof bonded to said at least one bond region means whereby said first and second sets of conductors are electrically connected to said one portion of said wire.

11. The device as set forth in claim 10 wherein said conductors of said first and second sets of conductors are arranged substantially coplanar and mutually substantially parallel.

12. In a method of making an integrated circuit device having a plurality of circuit components formed thereon including a plurality of bond pads electrically connected to said circuit components, the steps comprising:
 (a) forming a bond region having at least two electrically independent conductive portions being mutually adjacent and closely spaced; and
 (b) electrically connecting each of said at least two conductive portions to a different one of said plurality of bond pads.

13. The method as set forth in claim 12 including the steps of:
 forming said at least two electrically independent conductive portions each with a set of closely spaced conductors electrically connected to their respective conductive portions and mutually interlayed for a portion of their respective lengths.

14. The method as set forth in claim 13 including the setps of:
 bonding one end of a connector wire to said bond region so that said at least two electrically independent conductive portions are electrically connected to said one end of said connector wire.

* * * * *